United States Patent
Park et al.

(10) Patent No.: US 10,297,792 B2
(45) Date of Patent: May 21, 2019

(54) DISPLAY DEVICE HAVING A MICRO-CAVITY STRUCTURE AND METHOD FOR FORMING THE SAME

(71) Applicant: LG Display Co., Ltd., Seoul (KR)

(72) Inventors: ChooJin Park, Seoul (KR); Ho-Won Choi, Paju-si (KR); Eui-Doo Do, Paju-si (KR); Sung-Bin Shim, Yangsan-si (KR)

(73) Assignee: LG Display Co., Ltd., Seoul (KR)

( * ) Notice: Subject to any disclaimer, the term of this patent is extended or adjusted under 35 U.S.C. 154(b) by 7 days.

(21) Appl. No.: 15/690,206

(22) Filed: Aug. 29, 2017

(65) Prior Publication Data

US 2018/0062116 A1 Mar. 1, 2018

(30) Foreign Application Priority Data

Aug. 31, 2016 (KR) .................. 10-2016-0112199

(51) Int. Cl.
*H01L 51/52* (2006.01)
*H01L 27/32* (2006.01)
*H01L 51/56* (2006.01)

(52) U.S. Cl.
CPC ........ *H01L 51/5265* (2013.01); *H01L 27/322* (2013.01); *H01L 27/3258* (2013.01); *H01L 51/5209* (2013.01); *H01L 51/5218* (2013.01); *H01L 51/5234* (2013.01); *H01L 51/5284* (2013.01); *H01L 51/56* (2013.01); *H01L 2251/558* (2013.01)

(58) Field of Classification Search
CPC ............. H01L 51/5234; H01L 51/5265; H01L 51/5284; H01L 51/56; H01L 27/3211; H01L 27/322; H01L 27/3258; H01L 51/0023; H01L 51/5206; H01L 51/5218
See application file for complete search history.

(56) References Cited

U.S. PATENT DOCUMENTS

| | | |
|---|---|---|
| 2010/0200875 A1 | 8/2010 | Takei |
| 2010/0258804 A1 | 10/2010 | Tsai et al. |
| 2014/0183460 A1 | 7/2014 | Kim et al. |
| 2014/0191202 A1* | 7/2014 | Shim .................. H01L 51/5265 257/40 |

FOREIGN PATENT DOCUMENTS

EP 2 159 843 A2 3/2010

* cited by examiner

*Primary Examiner* — Roy K Potter
(74) *Attorney, Agent, or Firm* — Seed IP Law Group LLP

(57) ABSTRACT

A display device including a micro-cavity structure and a method for forming the same is provided. The display device includes light-emitting structures on pixel areas. In the display device, each of the pixel areas may realize a color different from an adjacent pixel area. In the display device, each of the light-emitting structures may include a reflective electrode, a resonant layer and a transparent electrode, which are sequentially stacked. In the display device, a side surface of the resonant layer and a side surface of the transparent electrode of the light-emitting structure may be surrounded by an interlayer insulating layer. Thus, in the display device, the reliability and the production efficiency may be improved.

17 Claims, 15 Drawing Sheets

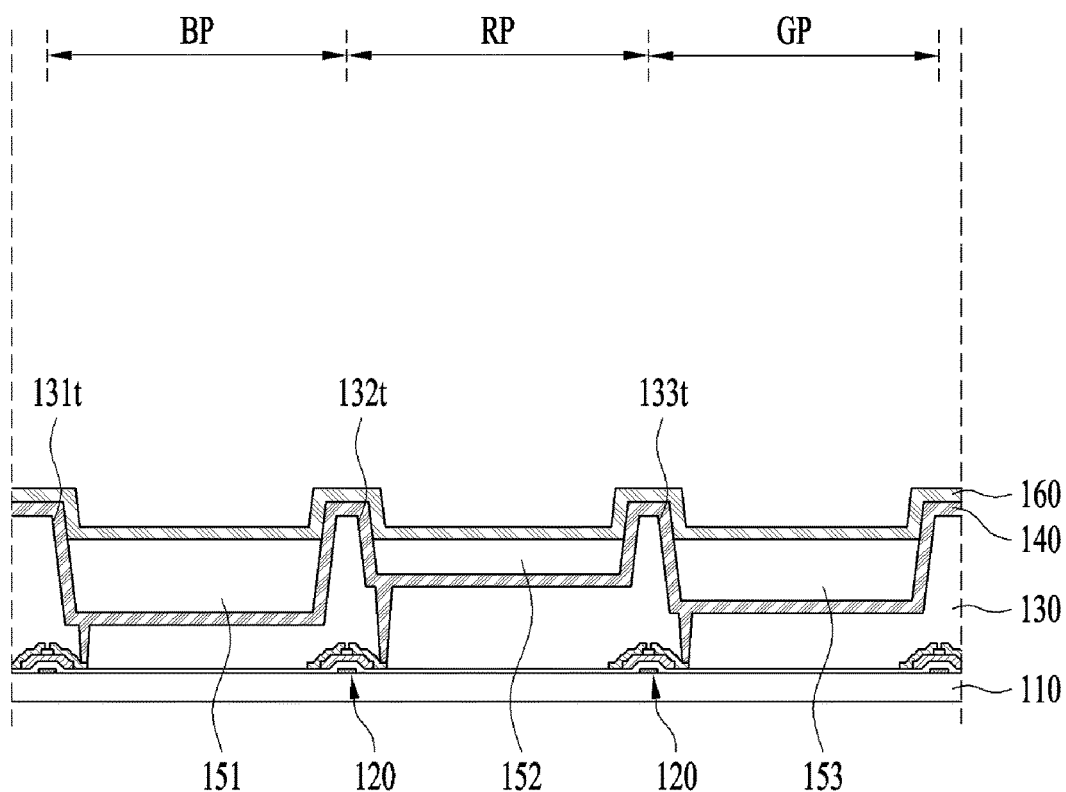

DISPLAY DEVICE HAVING A MICRO-CAVITY STRUCTURE AND METHOD FOR FORMING THE SAME

This application claims the priority benefit of Korean Patent Application No. 10-2016-0112199, filed on Aug. 31, 2016, which is hereby incorporated by reference as if fully set forth herein.

BACKGROUND

Technical Field

The present disclosure relates to a display device having a micro-cavity structure in order to improve luminous efficacy and a method of forming the same.

Description of the Related Art

Generally, an electronic appliance, such as a monitor, a TV, a laptop computer, and a digital camera, include a display device to realize an image. For example, the display device may include a liquid crystal display device and an organic light-emitting display device.

The display device may include pixel areas. Each pixel area may realize a color different from an adjacent pixel area. For example, the display device may include a blue pixel area realizing blue color, a red pixel area realizing red color and a green pixel area realizing green color.

A light-emitting structure may be disposed on each pixel area of the display device. For example, each of the light-emitting structures may include a lower electrode, a light-emitting layer and an upper electrode, which are sequentially stacked. The light-emitting structures may include a micro-cavity structure in order to improve luminous efficacy. For example, the lower electrode of each light-emitting structure may include a reflective electrode and a transparent electrode on the reflective electrode. The transparent electrode may include a thickness depending on a color realized by the corresponding pixel area.

However, in the display device including the micro-cavity structure by the thickness of the transparent electrode on the reflective electrode, the transparent electrode having a conductive material on each pixel area may have a thickness different from an adjacent pixel area realizing a color different from the corresponding pixel area. Thus, a method for forming the display device may include at least two etching process or deposition process in order to form the transparent electrodes on the pixel areas. Thereby, in the display device including the micro-cavity structure by the thickness of the transparent electrode, the forming process may be complicated and the process time may be increased.

Also, the thickness difference of the transparent electrodes on the pixel areas which output different colors may cause the height difference of the light-emitting structures. When the lower substrate in which the light-emitting structures are formed is attached to an upper substrate, the height difference of the light-emitting structures may cause the variation of the pressure applied to each pixel area. Therefore, in the display device including the micro-cavity structure in which the height difference of the light-emitting structures occur, the light-emitting structures may be damaged by the pressure variation or the attachment between the lower substrate and the upper substrate may become incomplete.

SUMMARY

Accordingly, the present disclosure is directed to a display device having a micro-cavity structure that substantially obviates one or more problems due to limitations and disadvantages of the related art.

An object of the present disclosure is to provide a display device in which a process of forming a micro-cavity structure may be simplified, and a method for forming the same.

Another object of the present disclosure is to provide a display device capable of preventing damage caused by a micro-cavity structure, and a method for forming the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a display device including an interlayer insulating layer having a first trench and a second trench shallower than the first trench. A first light-emitting structure is disposed on a bottom surface of the first trench of the interlayer insulating layer. The first light-emitting structure includes a first reflective electrode, a first resonant layer and a first transparent electrode, which are sequentially stacked. A second light-emitting structure is disposed on a bottom surface of the second trench of the interlayer insulating layer. The second light-emitting structure includes a second reflective electrode, a second resonant layer and a second transparent electrode, which are sequentially stacked. An upper surface of the first transparent electrode and an upper surface of the second transparent electrode are lower than an upper surface of the interlayer insulating layer.

A thickness of the second resonant layer may be smaller than a thickness of the first resonant layer.

A transmissivity of the first resonant layer may be higher than a transmissivity of the first transparent electrode. A transmissivity of the second resonant layer may be higher than a transmissivity of the second transparent electrode.

The second resonant layer may include the same material as the first resonant layer.

The upper surface of the second transparent electrode may be coplanar with the upper surface of the first transparent electrode.

The first reflective electrode may be connected to the first transparent electrode by extending along a sidewall of the first trench. The second reflective electrode may be connected to the second transparent electrode by extending along a sidewall of the second trench.

A first color filter may be disposed on the first light-emitting structure. A second color filter may be disposed on the second light-emitting structure. The light passing through the second color filter may have a wave-length shorter than the light passing through the first color filter.

A black matrix may be disposed between the first color filter and the second color filter. The black matrix may overlap with the upper surface of the interlayer insulating layer between the first trench and the second trench.

To accomplish another object of the present disclosure, a display device includes a lower substrate. A lower substrate includes a first pixel area and a second pixel area disposed close to the first pixel area. The second pixel area realizes a color different form the first pixel area. A first light-emitting structure is disposed on the first pixel area of the lower substrate. The first light-emitting structure includes a first resonant layer between a first reflective electrode and a first transparent electrode. A second light-emitting structure is disposed on the second pixel area of the lower substrate. The second light-emitting structure includes a second resonant layer between a second reflective electrode and a second transparent electrode. An interlayer insulating layer is disposed between the lower substrate and the first light-emitting structures. The interlayer insulating layer is extended between the lower substrate and the second light-emitting structure. The interlayer insulating layer is extended between the first transparent electrode of the first light-emitting structure and the second transparent electrode of the second light-emitting structure.

A distance between the lower substrate and the second transparent electrode may be the same as a distance between the lower substrate and the first transparent electrode.

The first resonant layer and the second resonant layer may include an insulating material.

A first color filter may be disposed on the first light-emitting structure. A second color filter may be disposed on the second light-emitting structure. A lower surface of the first light-emitting structure and a lower surface of the second light-emitting structure may be lower than the uppermost end of the interlayer insulating layer.

The lower surface of the second color filter may be coplanar with the lower surface of the first color filter.

To accomplish the other object of the present disclosure, a method of forming a display device includes a step of forming an interlayer insulating layer on a lower substrate having a first pixel area and a second pixel area disposed close to the first pixel area; a step of forming a first trench overlapping with the first pixel area and a second trench overlapping with the second pixel area in the interlayer insulating layer; a step of forming a reflective electrode material layer on the interlayer insulating layer in which the first trench and the second trench are formed; a step of forming a resonant material layer filling the first trench and the second trench on the reflective electrode material layer; a step of forming a first resonant layer having an upper surface disposed in the first trench and a second resonant layer having an upper surface disposed in the second trench by reducing a thickness of the resonant material layer; a step of forming a transparent electrode material layer on the lower substrate in which the first resonant layer and the second resonant layer; a step of forming a mask material layer on the transparent electrode material layer; a step of forming a first mask pattern overlapping with the first trench and a second mask pattern overlapping with the second trench by reducing the thickness of the mask material layer until an upper surface of the transparent electrode material layer between the first trench and the second trench is exposed; a step of forming a first reflective electrode and a first transparent electrode which are disposed in the first trench and a second reflective electrode and a second transparent electrode which are disposed in the second trench by etching the transparent electrode material layer and the reflective electrode material layer exposed by the first mask pattern and the second mask pattern; a step of sequentially forming a light-emitting layer and an upper electrode on the first transparent electrode and the second transparent electrode after removing the first mask pattern and the second mask pattern. The second pixel area realizes a color different from the first pixel area.

The resonant material layer may be formed of a material having a transmissivity higher than the transparent electrode material layer.

The reflective electrode material layer may be formed to include an upper surface parallel with a surface of the lower substrate on a bottom surface of the first trench and a bottom surface of the second trench.

The first reflective electrode, the first transparent electrode, the second reflective electrode, and the second transparent electrode may be formed by dry etching process.

The first trench and the second trench may be formed to having a different depth depending on a color realized by the corresponding pixel area.

The step of forming the first resonant layer and the second resonant layer may include a step of reducing a thickness of the resonant material layer so that a vertical distance between upper surfaces of the first/second resonant layers and an upper surface of the interlayer insulating layer is larger than a thickness of the transparent electrode material layer.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 3A to 3M are views sequentially showing a method of forming a display device according to an embodiment of the present disclosure.

DETAILED DESCRIPTION

Figure 1:
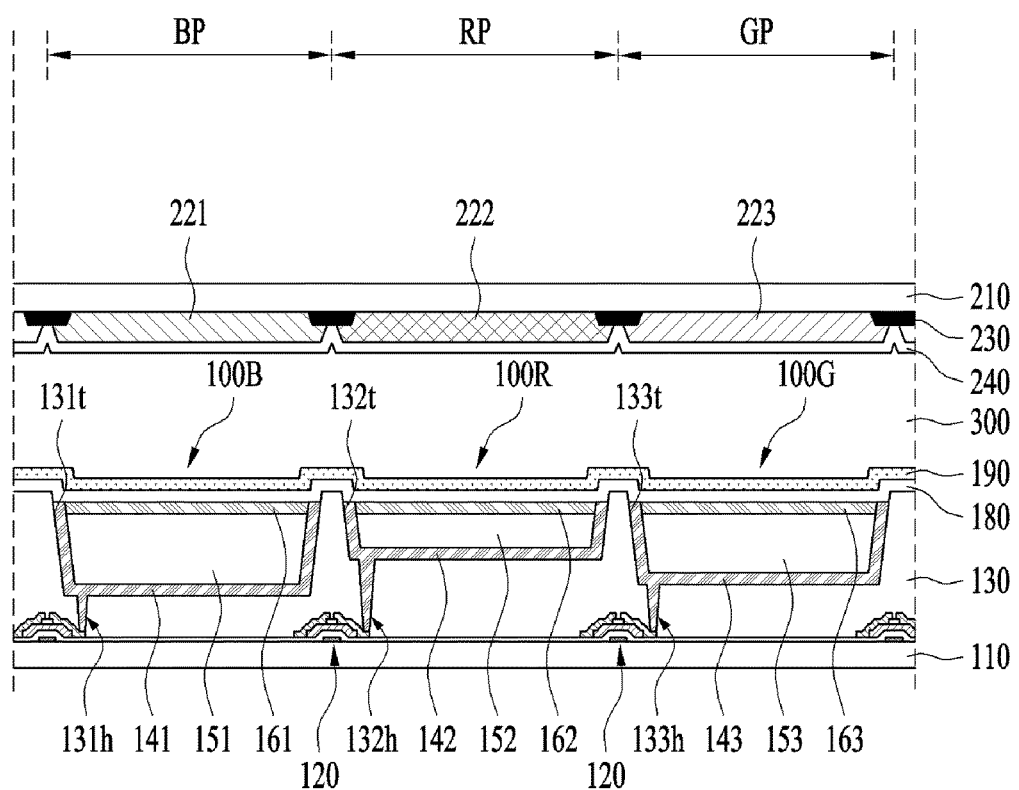
FIG. 1 is a cross-section view schematically showing a display device according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily understood by those skilled in the art sufficient to enable them to make and use the various embodiments disclosed herein, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be enlarged for convenience. It will be understood that, when a first element is referred to as being "on" a second element, although the first element may be disposed on the second element so as to come into contact with the second element, a third element may be interposed between the first element and the second element. The phrase "directly on" indicates that the element has no intervening material between it and the element it is directly on.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

FIG. 1 is a cross-section view schematically showing a display device according to an embodiment of the present disclosure.

Referring to FIG. 1, the display device according to the embodiment of the present disclosure may comprise a lower substrate 110, thin film transistors 120, an interlayer insulating layer 130, light-emitting structures 100B, 100R and 100G, and an upper substrate 210.

The lower substrate 110 may support the thin film transistors 120 and the light-emitting structures 100B, 100R and 100R. The lower substrate 110 may include an insulating material. For example, the lower substrate 110 may include glass or plastic.

The lower substrate 110 may include pixel areas BP, RP and GP. The pixel areas BP, RP and GP may output different colors. For example, the lower substrate 110 may include a blue pixel area BP, a red pixel area RP and a green pixel area GP.

The display device according to the embodiment of the present disclosure is described that the lower substrate includes three types of pixel areas BP, RP and GP. However, in the display device according to another embodiment of the present disclosure, the lower substrate 110 may include two or more types of pixel area. For example, the display device according to another embodiment of the present disclosure may include a lower substrate 110 having a blue pixel area BP, a red pixel area RP, a green pixel area GP and a white pixel area. The term "pixel" as used herein is used in the broadest sense to include both a complete pixel and subpixels, of which three or more may make up a single complete pixel.

The thin film transistors 120 may be disposed on a surface of the lower substrate 110 facing the upper substrate 210. Thin film transistors 120 may be disposed within the pixel areas BP, RP and GP of the lower substrate 110, respectively. For example, the thin film transistors 120 may be equally disposed in each pixel area BP, RP and GP of the lower substrate 110.

Each of the thin film transistors 120 may include a gate electrode disposed close to the lower substrate 110, a gate insulating layer on the gate electrode, a semiconductor layer on the gate insulating layer, a source electrode connected to an end region of the semiconductor layer, and a drain electrode connected to an opposite end region of the semiconductor layer. Each of the thin film transistor 120 may further include an etch stopper or other insulating material covering a surface of the semiconductor layer between the source electrode and the drain electrode.

The display device according to the embodiment of the present disclosure is described that the gate electrode of thin film transistors 120 are in direct contact with the lower substrate 110. However, the display device according to another embodiment of the present disclosure may further include a buffer layer between the lower substrate 110 and one or more elements of the thin film transistors 120. The buffer layer may include an insulating layer. For example, the buffer layer may include silicon oxide.

The display device according to the embodiment of the present disclosure is described that each of the thin film transistors 120 may have a structure in which the semiconductor layer is disposed on the gate electrode. However, in the display device according to another embodiment of the present disclosure, each of the thin film transistors 120 may include the gate electrode on the semiconductor layer.

The interlayer insulating layer 130 may be disposed on the thin film transistors 120. The thin film transistors 120 may be covered by the interlayer insulating layer 130. The interlayer insulating layer 130 may include an insulating material. For example, the interlayer insulating layer 130 may include silicon oxide.

The interlayer insulating layer 130 may include trenches 131t, 132t and 133t. The trenches 131t, 132t and 133t may be partially or fully disposed within the pixel areas BP, RP and GP, respectively. For example, the interlayer insulating layer 130 may include a first trench 131t in the blue pixel area BP, a second trench 132t in the red pixel area RP and a third trench 133t in the green pixel area GP.

The trenches 131t, 132t and 133t may be spaced apart from each other. For example, the interlayer insulating layer 130 between the trenches 131t, 132t and 133t may include an upper surface parallel with the surface of the lower substrate 110. The upper surface of the interlayer insulating layer 130 between the trenches 131t, 132t and 133t may overlap with boundary surfaces between the pixels BP, RP and GP.

The trenches 131t, 132t and 133t disposed within the pixel areas BP, RP and GP which output different colors may have different depths. For example, each of the trenches 131t, 132t and 133t may have a depth depending on a color output by the corresponding pixel area BP, RP and GP. The second trench 132t may be shallower than the first trench 131t. A bottom surface of the first trench 131t may be disposed closer to the lower substrate 110 than a bottom surface of the second trench 132t. The third trench 133t may be shallower than the first trench 131t. The third trench 133t may be deeper than the second trench 132t. A bottom surface of the third trench 133t may be disposed at a level that is between the bottom surface of the first trench 131t and the bottom surface of the second trench 132t. The widths of the trenches 131t, 132t and 133t may be the same or in some embodiments they may be different.

The light-emitting structures 100B, 100R and 100G may realize a specific color, respectively. Each of the light-emitting structures 100B, 100R and 100G may have a micro-cavity structure. For example, each of the light-emitting structures 100B, 100R and 100G may include a reflective electrode 141, 142 and 143, a resonant layer 151, 152 and 153, a transparent electrode 161, 162 and 163, a light-emitting layer 180 and an upper electrode 190, which are sequentially stacked.

The light-emitting structures 100B, 100R and 100G may be disposed on the pixel areas BR, RP and GP of the lower substrate 110, respectively. For example, the light-emitting structures 100B, 100R and 100G may include a blue light-emitting structure 100B on the blue pixel area BP of the lower substrate 110, a red light-emitting structure 100R on the red pixel area RP of the lower substrate 110 and a green light-emitting structure 100G on the green pixel area GP of the lower substrate 110.

Each of the light-emitting structures 100B, 100R and 100G may be disposed on the bottom surface of the trench 131t, 132t and 133t positioned within the corresponding pixel area BP, RP and GP. For example, the reflective electrode 141, 142 and 143, the resonant layer 151, 152 and 153, the transparent electrode 161, 162 and 163, the light-emitting layer 180 and the upper electrode 190 of each light-emitting structure 100B, 100R and 100G may be sequentially stacked on the bottom surface of the corresponding trench 131t, 132t and 133t of the interlayer insulating layer 130.

The light-emitting structures 100B, 100R and 100G may selectively generate the light realizing a specific color by the thin film transistors 120. For example, the reflective electrode 141, 142 and 143 of each light-emitting structure 100B, 100R and 100G may be electrically connected to the thin film transistor 120 disposed within the corresponding pixel area BP, RP and GP. For example, the interlayer insulating layer 130 may further include contact holes 131h, 132h and 133h so that the reflective electrode 141, 142 and 143 of each the light-emitting structure 100B, 100R and 100G may be connected to the corresponding thin film transistor 120.

Each of the contact holes 131h, 132h and 133h of the interlayer insulating layer 130 may be disposed under the corresponding trench 131t, 132t and 133t. The contact holes 131h, 132h and 133h may be disposed near a sidewall of the corresponding trench 131t, 132t and 133t.

The contact holes 131h, 132h and 133h of the interlayer insulating layer 130 may be completely filled by the reflective electrode 141, 142 and 142 of the corresponding light-emitting structure 100B, 100R and 100G. For example, a first contact hole 131h exposing a portion of the thin film transistor 120 within the blue pixel area BP may be completely filled by the first reflective electrode 141 of the blue light-emitting structure 100B. A second contact hole 132h exposing a portion of the thin film transistor 120 within the red pixel area RP may be completely filled by the second reflective electrode 142 of the red light-emitting structure 100R. A third contact hole 133h exposing a portion of the thin film transistor 120 within the green pixel area GP may be completely filled by the third reflective electrode 143 of the green light-emitting structure 100G. Upper surfaces of the reflective electrodes 141, 142 and 143 on the bottom surfaces of the trenches 131t, 132t and 133t of the interlayer insulating layer 130 may be parallel with the surface of the lower substrate 110.

The reflective electrodes 141, 142 and 143 may include a material having high-reflectance. For example, the reflective electrodes 141, 142 and 145 may include a metal, such as aluminum (Al). Each of the reflective electrodes 141, 142 and 143 may have a multi-layer structure.

The resonant layers 151, 152 and 153 may be disposed on the corresponding reflective electrode 141, 142 and 143, respectively. For example, the blue light-emitting structure 100B may include a first resonant layer 151 on the first reflective electrode 141. The red light-emitting structure 100R may include a second resonant layer 152 on the second reflective electrode 142. The third light-emitting structure 100G may include a third resonant layer 153 on the third reflective electrode 143.

Upper surfaces of the resonant layers 151, 152 and 153 may be lower than the upper surface of the interlayer insulating layer 130 between the trenches 131t, 132t and 133t. For example, the upper surface of the first resonant layer 151 may be disposed at the inside of the first trench 131t. The upper surface of the second resonant layer 152 may be disposed at the inside of the second trench 132t. The upper surface of the third resonant layer 153 may be disposed at the inside of the third trench 133t. The resonant layers 151, 152 and 153 may be separated by the interlayer insulating layer 130 between the trenches 131t, 132t and 133t. The interlayer insulating layer 130 may be extended between the resonant layers 151, 152 and 153.

The light-emitting structures 100B, 100R and 100G may have a micro-cavity structure by the corresponding resonant layer 151, 152 and 153. For example, the resonant layers 151, 152 and 153 in the pixel areas BP, RP and GP realizing different colors may have different depths. The second resonant layer 152 may be thinner than the first resonant layer 151. The third resonant layer 153 may be thinner than the first resonant layer 151. The third resonant layer 153 may be thicker than the second resonant layer 152. The thickness of each resonant layer 151, 152 and 153 may be proportioned to the depth of the corresponding trench 131t, 132t and 133t.

The upper surfaces of the resonant layers 151, 152 and 153 may be disposed in the same plane. For example, the upper surface of the second resonant layer 152 may be disposed in the same plane as the upper surface of the first resonant layer 151. The upper surface of the third resonant layer 153 may be coplanar with the upper surface of the first resonant layer 151 and the upper surface of the second resonant layer 152.

In the display device according to the embodiment of the present disclosure, the interlayer insulating layer 130 may include trenches 131t, 132t and 133t having a depth depending on a thickness of the corresponding resonant layer 151, 152 and 153 in order to the micro-cavity structure. Thus, in the display device according to the embodiment of the present disclosure, the transparent electrode 161, 162 and 163, the light-emitting layer 180 and the upper electrode 190 on the corresponding resonant layer 151, 152 and 153 in each pixel area BP, RP and GP may have the same height. Therefore, in the display device according to the embodiment of the present disclosure, the uppermost ends of the light-emitting structures 100B, 100R and 100G on the pixel areas BP, RP and GP realizing different colors may be disposed in the same plane.

The resonant layers 151, 152 and 153 may include an insulating material. For example, the transmissivity of each resonant layer 151, 152 and 153 may be higher than the transmissivity of the transparent electrode 161, 162 and 163 of the corresponding light-emitting structure 100B, 100R and 100P. Thus, in the display device of the embodiment of the present disclosure, the luminous efficacy may be further improved by the micro-cavity structure. The resonant layers 151, 152 and 153 may all include the same material.

The transparent electrodes 161, 162 and 163 may be disposed on the corresponding resonant layer 151, 152 and 153. A distance between the lower substrate 110 and each transparent electrode 161, 162 and 163 may be the same in each pixel area BP, RP and GP. For example, a lower surface of a second transparent electrode 162 on the red pixel area RP may be the same plane as a lower substrate of a first transparent electrode 161 on the blue pixel area BP. A lower surface of the third transparent electrode 163 on the green pixel area GP may be coplanar with the lower surface of the first transparent electrode 161 and the lower surface of the second transparent electrode 162.

The transparent electrodes 161, 162 and 163 may include a conductive material. For example, the transparent electrodes 161, 162 and 163 may include a transparent conductive material, such as ITO and IZO.

For example, each of the transparent electrodes 161, 162 and 163 may serve as a lower electrode of the corresponding light-emitting structure 100B, 100R and 100G. The transparent electrodes 161, 162 and 163 may be electrically connected to the corresponding reflective electrode 141, 142 and 143. For example, the reflective electrode 141, 142 and 143 may be extended along a sidewall of the corresponding trench 131t, 132t and 133t of the interlayer insulating layer 130. The first reflective electrode 141 may be extended onto a side surface of the first transparent electrode 161 of the blue light-emitting structure 100B along the sidewall of the first trench 131t. The second reflective electrode 142 may be extended onto a side surface of the second transparent electrode 162 of the red light-emitting structure 100R along the sidewall of the second trench 132t. The third reflective electrode 143 may be extended onto a side surface of the third transparent electrode 163 of the green light-emitting structure 100B along the sidewall of the third trench 133t. The side surfaces of the transparent electrodes 161, 162 and 163 may be in direct contact with the corresponding reflective electrode 141, 142 and 143.

The transparent electrodes 161, 162 and 163 on the different pixel areas BP, RP and GP may be separated by the interlayer insulating layer 130. For example, upper surfaces of the transparent electrode 161, 162 and 163 may be lower than the upper surface of the interlayer insulating layer 130 between the trenches 131t, 132t and 133t. An upper surface of the first transparent electrode 161 may be disposed in the first trench 131t. An upper surface of the second transparent electrode 162 may be disposed in the second trench 132t. An upper surface of the third transparent electrode 163 may be disposed in the third trench 133t. The interlayer insulating layer 130 may be extended between the transparent electrodes 161, 162 and 163.

In the display device according to the embodiment of the present disclosure, the transparent electrodes 161, 162 and 163 may be disposed within the trenches 131t, 132t and 133t of the interlayer insulating layer 130. Thus, in the display device according to the embodiment of the present disclosure, a technical feature, such as a bank insulating layer for separating the transparent electrodes 161, 162 and 163 serving as a lower electrode of the light-emitting structures 100B, 100R and 100G may be not formed. Therefore, in the display device according to the embodiment of the present disclosure, the production process may be simplified and the process time may be reduced.

The transparent electrodes 161, 162 and 163 may have the same thickness. For example, the upper surfaces of the transparent electrodes 161, 162 and 163 may be disposed in the same plane.

The light-emitting structures 100B, 100R and 100G may realize the same color in the pixel areas BP, RP and GP. For example, the light-emitting structures 100B, 100R and 100G may include a light-emitting layer 180 formed by the same material. For example, the light-emitting layers 180 of the light-emitting structure 100B, 100R and 100G may be connected to each other. The light-emitting structures 100B, 100R and 100G may include a light-emitting layer 180 extended onto the transparent electrodes 161, 162 and 163. The light-emitting layer 180 of each light-emitting structure 100B, 100R and 100G may be extended onto the upper surface of the interlayer insulating layer 130 between the trenches 131t, 132t and 133t. For example, the light-emitting layer 180 of each light-emitting structure 100B, 100R and 100G may realize a white color.

The light-emitting layer 180 of each light-emitting structure 100B, 100R and 100G may include a emitting material layer (EML) having an emission material. The emission material may include an organic material, an inorganic material, or a hybrid material. For example, the display device according to the embodiment of the present disclosure may be an organic light-emitting display device including an organic light-emitting layer.

The light-emitting layer 180 of each light-emitting structure 100B, 100R and 100G may have a multi-layer structure in order to improve luminous efficacy. For example, the light-emitting layer 180 of each light-emitting structure 100B, 100R and 100G may further include a hole injection layer (HIL), a hole transport layer (HTL), an electron transport layer (ETL), and an electron injection layer (EIL).

The upper electrodes 190 of the light-emitting structures 100B, 100R and 100G may be extended along the light-emitting layer 180 of each light-emitting structure 100B, 100R and 100G. For example, each of the light-emitting structures 100B, 100R and 100G may include the upper electrode 190 extended onto the adjacent pixel area BP, RP and GP.

The upper electrode 190 includes a conductive material in one embodiment. The upper electrode 190 may include a transparent material. For example, the upper electrode 190 may include the same material as the transparent electrodes 161, 162 and 163.

The upper substrate 210 may be disposed on the upper electrode 190. The upper substrate 210 may include an insulating material. The upper substrate 210 may include a transparent material. For example, the upper substrate 210 may include glass or plastic.

Color filters 221, 222 and 223 may be disposed on a surface of the upper substrate 210 facing the lower substrate 110. The color filters 221, 222 and 223 may convert the light generated by the light-emitting structures 100B, 100R and 100G to the light realizing a specific color. Each of the color filters 221, 222 and 223 may be disposed on the corresponding light-emitting structure 100B, 100R and 100G. For example, the color filters 221, 222 and 223 may include a blue color filter 221 on the blue light-emitting structure 100B, a red color filter 222 on the red light-emitting structure 100R and a green color filter 223 on the green light-emitting structure 100G.

A black matrix 230 is disposed between the color filters 221, 222 and 223 in one embodiment. The black matrix 230 may overlap with a boundary surface between the pixel areas BP, RP and GP. For example, the black matrix 230 may overlap the upper surface of the interlayer insulating layer 130 between the trenches 131t, 132t and 133t. The display device according to the embodiment of the present disclosure may further comprise an upper passivation layer 240 on the color filters 221, 222 and 223 and the black matrix 230. The upper passivation layer 240 may include an insulating material.

The display device according to the embodiment of the present disclosure may further comprise an adhesive layer 300 between the upper electrode 190 and the upper substrate 210. For example, the upper substrate 210 in which the color filters 221, 222 and 223 and the black matrix 230 are formed may be attached to the lower substrate 110 in which the thin film transistors 120 and the light-emitting structures 100B, 100R and 100G are formed due to the adhesive layer 300. The adhesive layer 300 may include a thermosetting resin. For example, the adhesive layer 300 may further include a moisture-absorbing material.

Accordingly, in the display device according to the embodiment of the present disclosure, the interlayer insulating layer 130 between the thin film transistors 120 and the light-emitting structures 100B, 100R and 100P may include trenches 131t, 132t and 133t having different depths depending on the color realized in the corresponding pixel area BP, RP and GP, and each of the light-emitting structures 100B, 100R and 100G may have a micro-cavity structure by the thickness of the resonant layer 151, 152 and 153 disposed at the inside of the corresponding trench 131t, 132t and 133t, so that the damage due to the micro-cavity structure may be prevented. Thus, in the display device according to the embodiment of the present disclosure, the luminous efficacy and the reliability may be improved without the decrease of the production efficacy.

Figure 2:
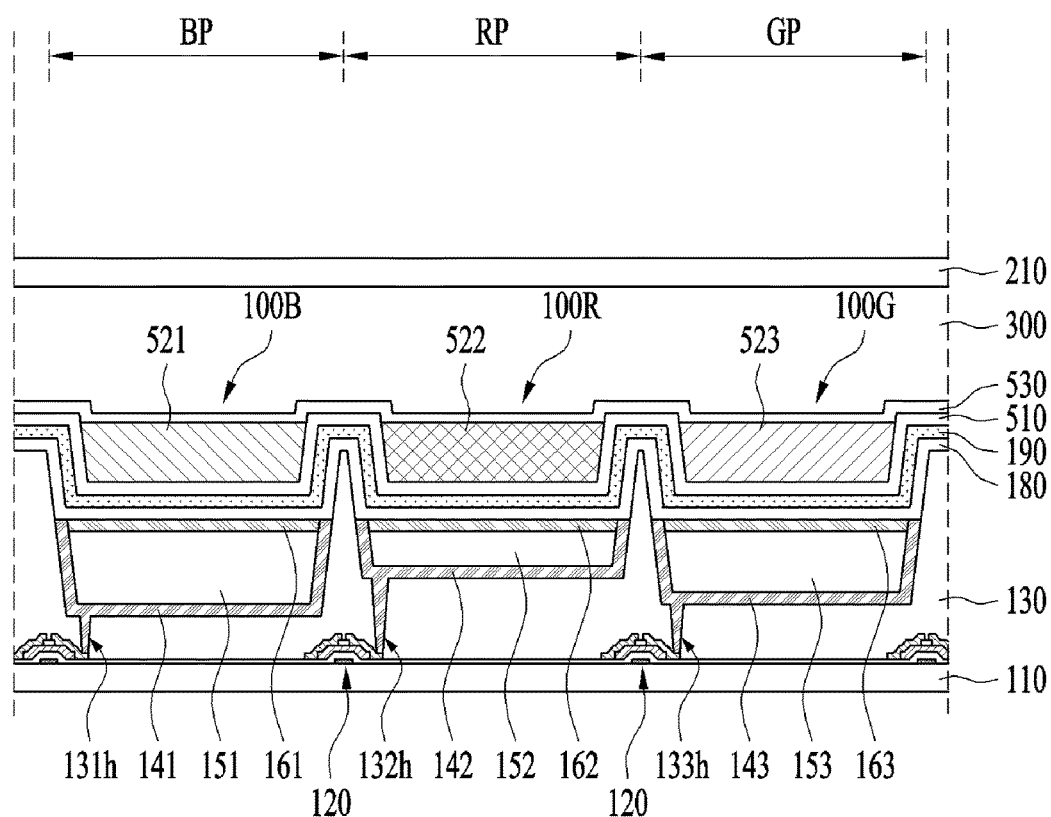
FIG. 2 is a cross-section view schematically showing a display device according to another embodiment of the present disclosure.

The display device according to the embodiment of the present disclosure is described that the color filters 221, 222 and 223 and the black matrix 230 are disposed on the upper substrate 210. However, the display device according to another embodiment of the present disclosure may include color filters 521, 522 and 523 disposed close to an upper surface of the corresponding light-emitting structure 100B, 100R and 100G, as shown in FIG. 2. For example, in the display device according to another embodiment of the present disclosure, the interlayer insulating layer 130 between the trenches 131t, 132t and 133t may be extended in a direction toward the upper surface 210 so that missalignment of the color filters 521, 522 and 523 may be prevented. In the display device of another embodiment of the present disclosure, lower surfaces of the color filters 521, 522 and 523 may be disposed in the same plane. In the display device of another embodiment of the present disclosure, the uppermost end of the interlayer insulating layer 130 between the trenches 131t, 132t and 133t may be extended to a location higher than the lower surfaces of the color filters 521, 522 and 523.

As shown in FIG. 2, the display device according to another embodiment of the present disclosure may further comprise a lower passivation layer 510 in order to prevent the damage of the light-emitting structure 100B, 100R and 100G due to a process of forming the color filters 521, 522 and 523. The lower passivation layer 510 may be extended along the upper electrode 190 of the light-emitting structures 100B, 100R and 100G. The lower passivation layer 510 may have a stacked structure of an inorganic insulating layer and an organic insulating layer. For example, the lower passivation layer 510 may have a structure in which the organic insulating layer is disposed between the inorganic insulating layers. An upper passivation layer 530 may be disposed on upper surfaces of the color filters 521, 522 and 523.

FIGS. 3A to 3M are views sequentially showing a method of forming a display device according to an embodiment of the present disclosure.

Figure 3A:
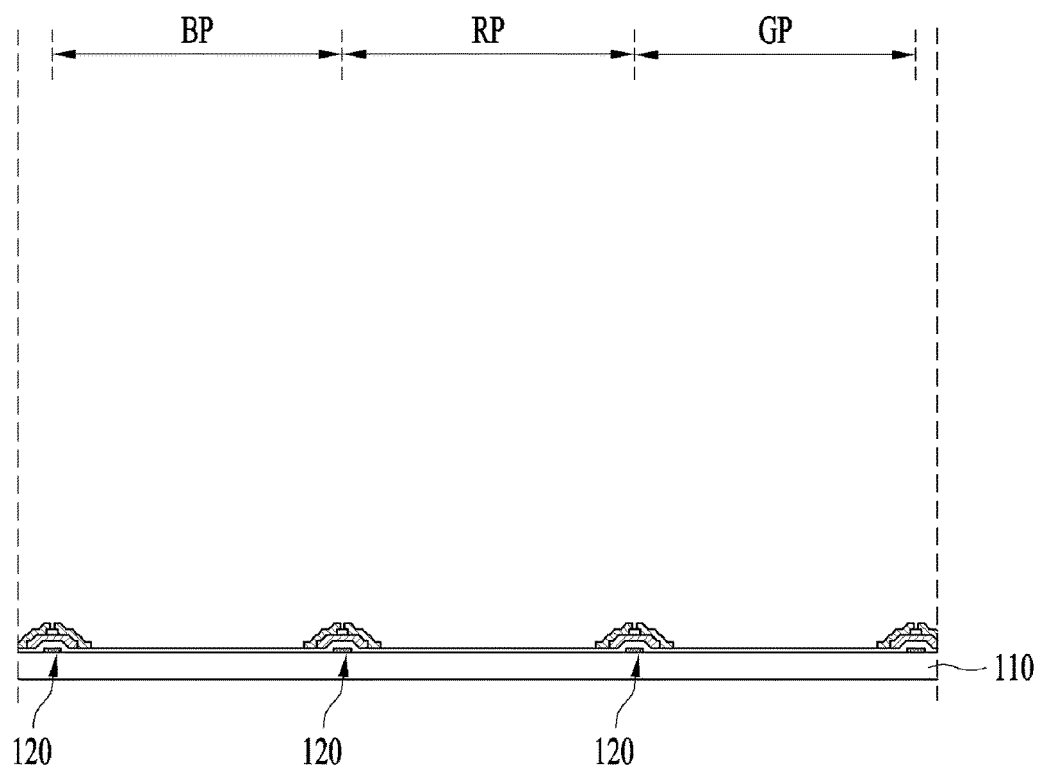

A method of forming the display device according to an embodiment of the present disclosure will be described with reference to FIGS. 1 and 3A to 3M. First, as shown in FIG. 3A, the method of forming the display device according to the embodiment of the present disclosure may include a step of forming thin film transistors 120 in pixel areas BP, RP and GP of a lower substrate 110.

The pixel areas BP, RP and GP may be disposed close to each other. The pixel areas BP, RP and GP may output different colors. For example, the pixel areas BP, RP and GP may include a blue pixel area BP realizing blue color, a red pixel area RP realizing red color, and a green pixel area GP realizing green color.

Each of the thin film transistors 120 may include a gate electrode, a gate insulating layer, a semiconductor pattern, a source electrode and a drain electrode. For example, the step of forming the thin film transistors 120 may include a step of forming the gate electrodes on the lower substrate 110, a step of forming the gate insulating layer on each gate electrode, a step of forming the semiconductor pattern on each gate insulating layer, and a step of forming the source electrode and the drain electrode on each semiconductor pattern.

Figure 3B:
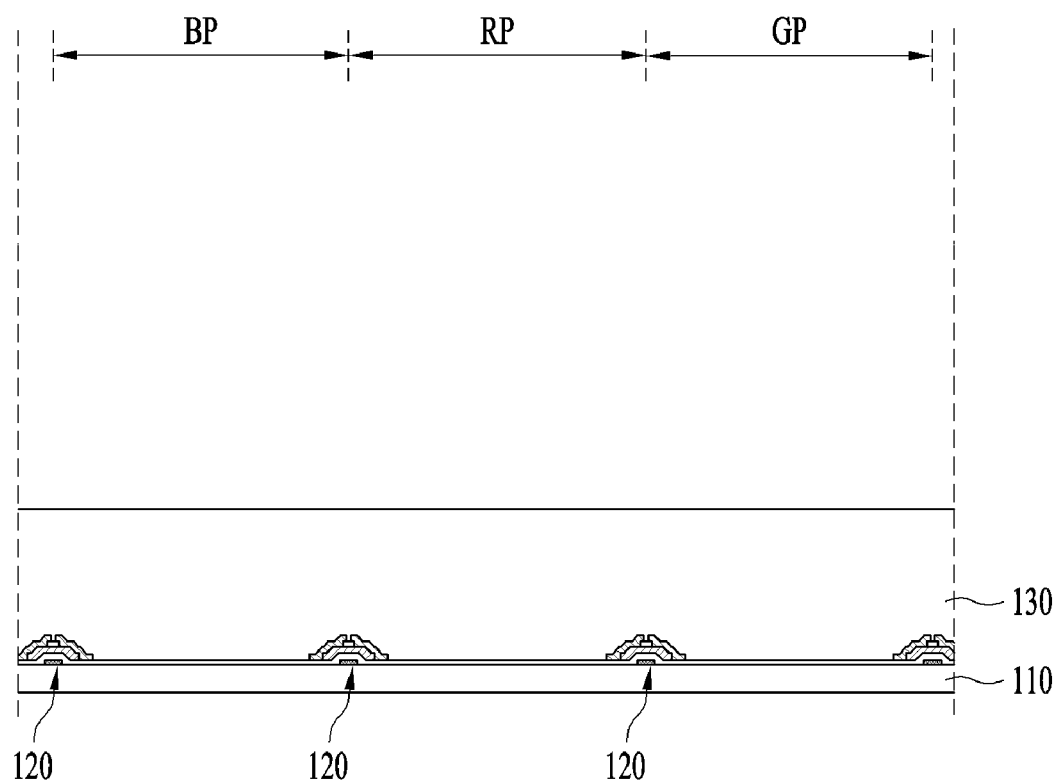

As shown in FIG. 3B, the method of forming the display device according to the embodiment of the present disclosure may include a step of forming an interlayer insulating layer 130 covering the thin film transistors 120 on the lower substrate 110.

The thin film transistors 120 may be completely covered by the interlayer insulating layer 130. The interlayer insulating layer 130 may include an insulating material. For example, the interlayer insulating layer 130 is formed of silicon oxide in one embodiment.

Figure 3C:
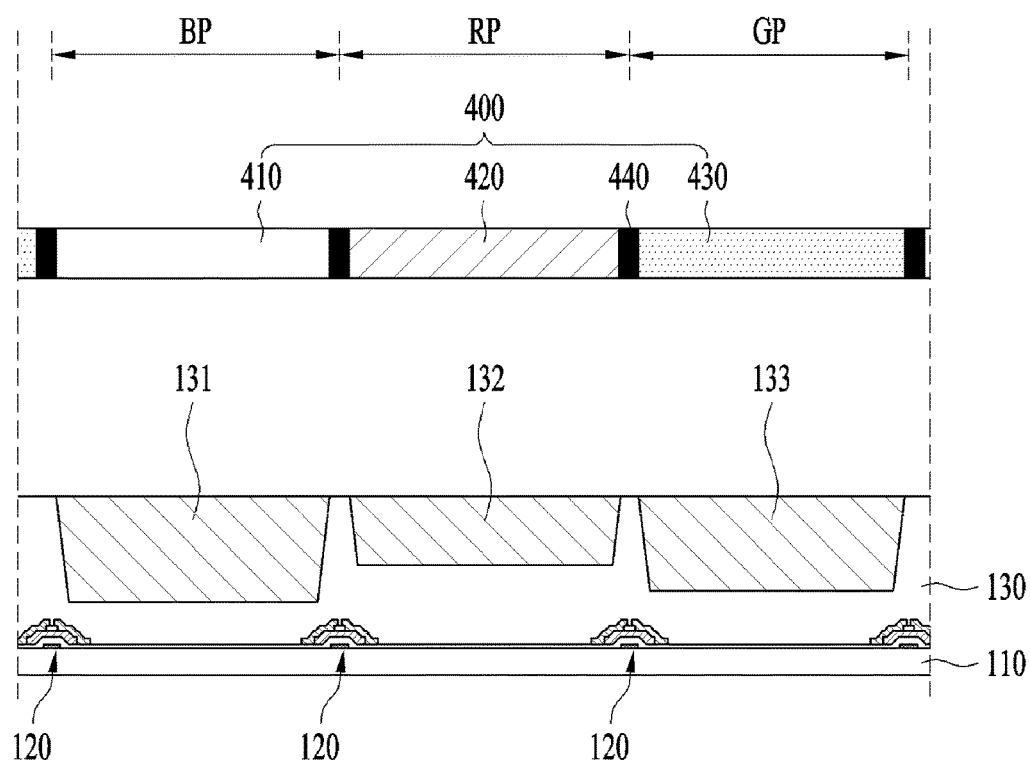

As shown in FIG. 3C, the method of forming the display device according to the embodiment of the present disclosure may include a step of forming regions 131, 132 and 133 to be removed in the interlayer insulating layer 130 using half-tone mask 400.

The regions 131, 132 and 133 may be spaced apart from each other. The regions 131, 132 and 133 may be disposed in different pixel areas BP, RP and GP which output different colors. The regions 131, 132 and 133 may have different depths.

The half-tone mask 400 may include transmission portions 410, 420 and 430 having different transmissivities. The transmission portions 410, 420 and 430 may be disposed on different pixel areas BP, RP and GP which output different colors. For example, the half-tone mask 400 may include a first transmission portion 410 on the blue pixel area BP, a second transmission portion 420 on the red pixel area RP, a third transmission portion 430 on the green pixel area GP, and a light shielding portion 440 between the transmission portions 410, 420 and 430. The relative transmissivity of each transmission portion 410, 420 and 430 may vary depending on the specific color realized by the light emitted in the corresponding pixel area BP, RP and GP. For example, the transmissivity of the second transmission portion 420 may be lower than the transmissivity of the first transmission portion 410. The transmissivity of the third transmission portion 430 may be lower than the transmissivity of the first transmission portion 410. The transmissivity of the third transmission portion 430 may be higher than the transmissivity of the second transmission portion 420.

For example, the depths of the regions 131, 132 and 133 to be removed may be determined by the corresponding transmission portion 410, 420 and 430 of the half-tone mask 400 on the corresponding pixel area BP, RP and GP. For example, the region 132 formed in the red pixel area RP may be formed thinner than the region 131 formed in the blue pixel area BP. The region 133 formed in the green pixel area GP may be formed thinner than the region 131 formed in the blue pixel area BP. The region 133 formed in the green pixel area GP may be formed thicker than the region 132 formed in the red pixel area BP.

The transmissivity of the various transmission portions 410, 420, and 430 is selected to create a desired depth of the exposed regions 131, 132, and 133, respectively. Namely, for high transmissivity as shown in portion 410, the light passing through the first transmission portion 410 will go to a great depth in layer 130 as shown by hatched region 131 in FIG. 3C. Second transmission portion 420 has lower transmissivity than portion 410 and, thus, substantially attenuates the light that is passing therethrough. Because of the light attenuation passing through portion 420, the depth of the light into region 130 will be less in the area 132 than in area 131, resulting in a more shallow region 132 formed in the red pixel region. The transmissivity of portion 430 is selected to provide a desired depth for the region 133. Thus, the transmissivity of the various portions of half-tone mask 400 are selected to obtain a desired depth of each of the respective regions 131, 132, and 133. The depth of the regions can be fine tuned, and selected by varying the optical transmissivity of the respective transmission portions 410, 420, and 430 as desired for different pixels and in different embodiments. If other colors are provided, such as white, yet a different level of relative transmissivity can be provided for that particular pixel area, as well as for any other pixel areas in which it is desired to have a different depth of the region to be etched in the layer 130.

The interlayer insulating layer 130 between the regions 131, 132 and 133 may overlap with the light shielding portion 440 of the half-tone mask 400. For example, the interlayer insulating layer 130 between the regions 131, 132 and 133 may be not exposed to the light forming the regions 131, 132 and 133 to be removed by the light shielding portion 440 of the half-tone mask 400. The regions 131, 132 and 133 may be separated by the light shielding portion 440.

Figure 3D:
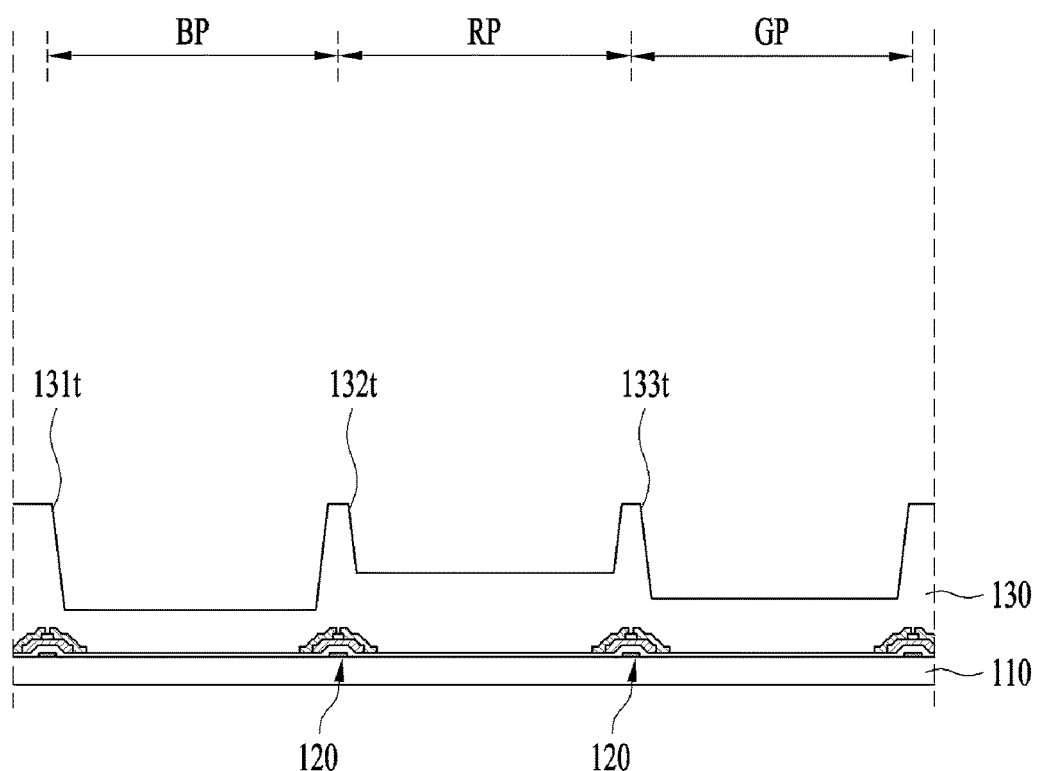

As shown in FIG. 3D, the method of forming the display device according to the embodiment of the present disclosure may include a step of forming trenches 131t, 132t and 133t in the interlayer insulating layer 130.

The step of forming the trenches 131t, 132t and 133t may include a step of removing the regions 131, 132 and 133. For example, the trenches 131t, 132t and 133t may include a first trench 131t formed in the blue pixel area BP, a second trench 132t formed in the red pixel area RP and a third trench 133t formed in the green pixel area GP. The trenches 131t, 132t and 133t may have different depths depending on the realized color in the corresponding pixel area BP, RP and GP, such as the regions 131, 132 and 133.

Preferably, the trenches 131t, 132t, and 133t are formed in a single etch step, without the use of a mask. In particular, the regions 131, 132, and 133 which have been illuminated into the layer 130 have been exposed to light that will permit the material 130 to be selectively etched with respect to those regions not exposed to light. Thus, once layer 400 is removed, then a blanket etch can take place and those portions which have been exposed through the half-tone mask 400 will be selectively etched away while those portions which have not been exposed through the half-tone mask 400 will be substantially unetched.

The use of the different transmissivity levels in the half-tone mask 400 provides substantial benefits at this stage of the process. In particular, the region 131 will be etched to the depth that the light exposure reached in layer 130. After it reaches this depth, the etching will not proceed because the portions of layer 130 below the depth of 131 have not been exposed to light and, therefore, will not be etched. Similarly, region 132 will be etched to a much more shallow etch even though it is exposed to the same etching process at the same time that layer 131 is etched. Because the transmissivity of filter 420 was less, the light exposer in region 132 is more shallow than in region 131. Therefore, when the blanket etch is carried out the depth of the etch in region 132 will be much more shallow resulting in a trench in the region 132 which is much more shallow than in regions 131 and 133. The use of the half-tone mask 400 having different regions with different light transmissivities, therefore, permits a blanket etch to be carried out which will stop at the depth to which the regions were exposed through the respective mask areas. This process substantially reduces the number of different masks to be used in the etching step process. Accordingly, instead of having to use a separate mask, with each having a photolithographic process, with a separate etch for each of the areas 131, 132, and 133 which would require the use of three masks and photolithographic steps, and three different etch times carried out sequentially, one after the other, a single etch step can take place which carries out a simultaneous etch of each section 131, 132, and 133 with each etch stopping at the proper depth which has been selected based on the light transmissivity of respective portions 410, 420, and 430 of the half-tone mask 400.

The type of etch carried out to provide the selective etch can be based on the desired etch properties of the layer 130. In one embodiment, wet etch is used, which carries out a selective etch of the light exposed portions of layers 130 while not etching those areas not exposed to light in layer 130. Alternatively, a dry etch, which may include a plasma etch, or any etch of the many which are available in the art to selectively etch the light exposed regions in layer 130.

Figure 3E:
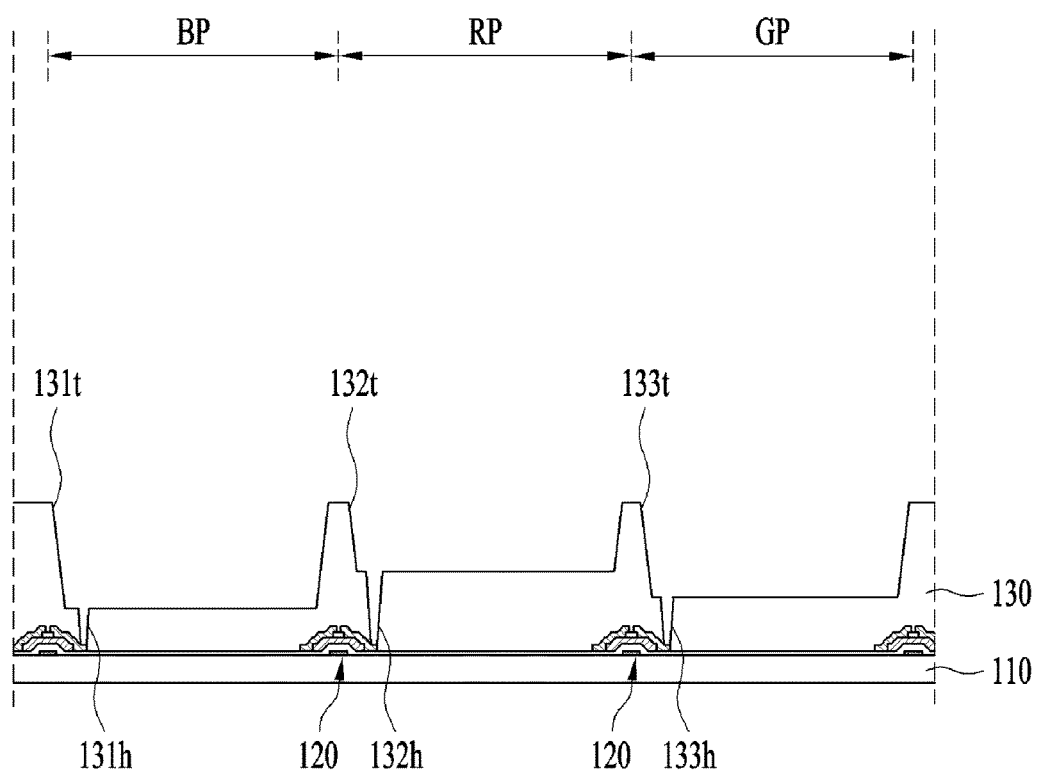

As shown in FIG. 3E, the method of forming the display device according to the embodiment of the present disclosure may include a step of forming contact holes 131h, 132h and 133h in the interlayer insulating layer 130.

The contact holes 131h, 132h and 133h may expose a portion of the corresponding thin film transistor 120 in the corresponding pixel area BP, RP and GP, respectively. For example, each of the contact holes 131h, 132h and 133h may be formed in a bottom surface of the corresponding trench 131t, 132t and 133t. The contact holes 131h, 132h and 133h may be formed close to a sidewall of the corresponding trench 131t, 132t and 133, respectively.

Figure 3F:
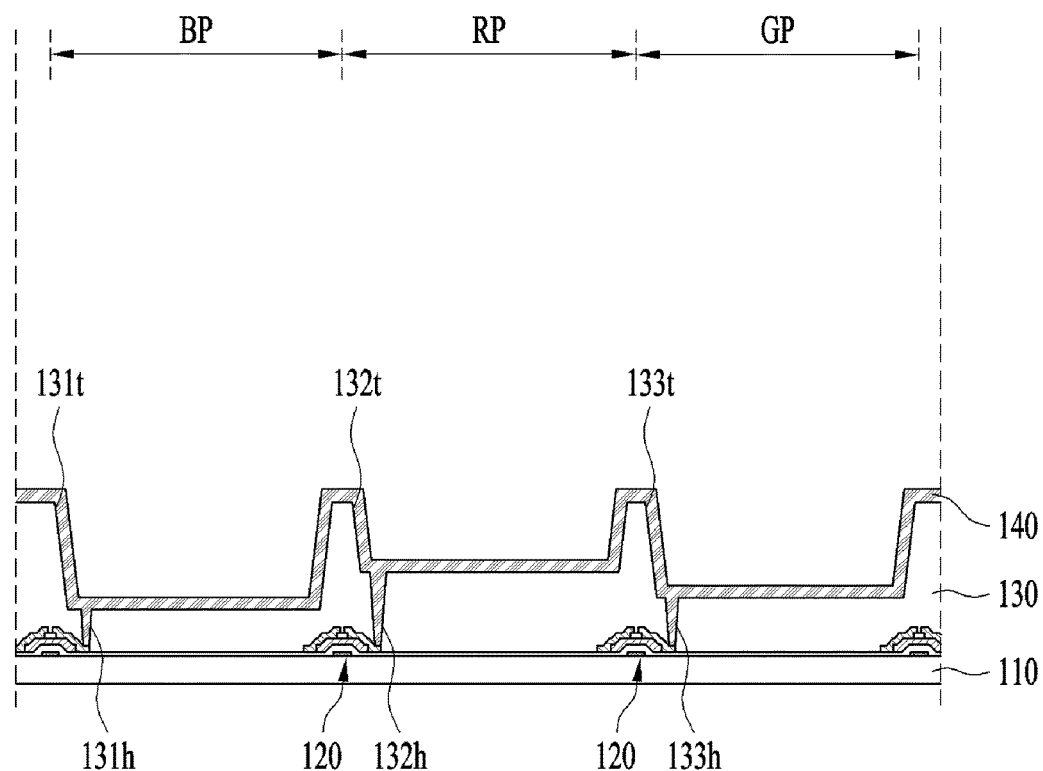

As shown in FIG. 3F, the method of forming the display device according to the embodiment of the present disclosure may include a step of forming a reflective electrode material layer 140 on the interlayer insulating layer 130 in which the trenches 131t, 132t and 133t are formed.

The reflective electrode material layer 140 may be extended along a surface of the interlayer insulating layer 130. The reflective electrode material layer 140 may be formed to completely fill the contact holes 131h, 132h and 133h of the interlayer insulating layer 130. An upper surface of the reflective electrode material layer 140 on the bottom surface of the trenches 131t, 132t and 133t of the interlayer insulating layer 130 may be parallel with an upper surface of the lower substrate 110.

The reflective electrode material layer 140 may include a conductive material. For example, the reflective electrode material layer 140 may include a metal, such as aluminum (Al).

Figure 3G:
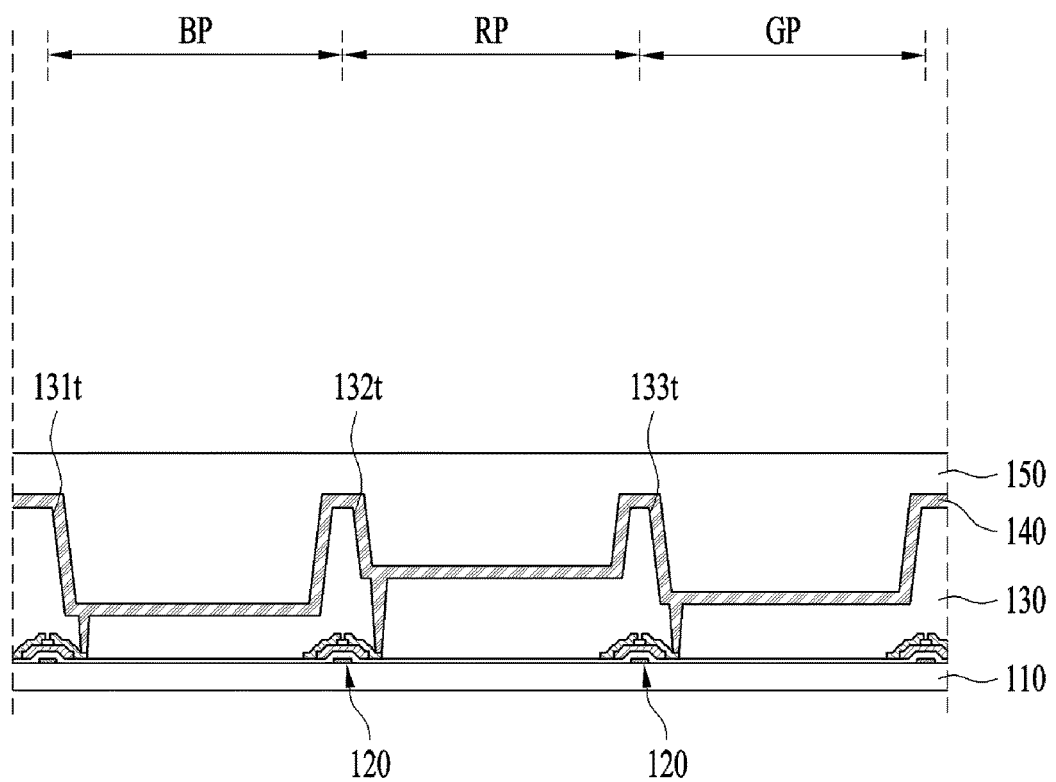

As shown in FIG. 3G, the method of forming the display device according to the embodiment of the present disclosure may include a step of forming a resonant material layer 150 on the reflective electrode material layer 140.

The resonant material layer 150 may be formed to fill the trenches 131t, 132t and 133t of the interlayer insulating layer 130. The resonant material layer 150 may include an insulating material. The resonant material layer 150 may be formed of a material having a transmissivity higher than a transparent electrode material layer which is formed by the subsequent process. In one example, the resonant layer 150 may include one of epoxy, silicon, olefin, acrylic and imide.

Figure 3H:
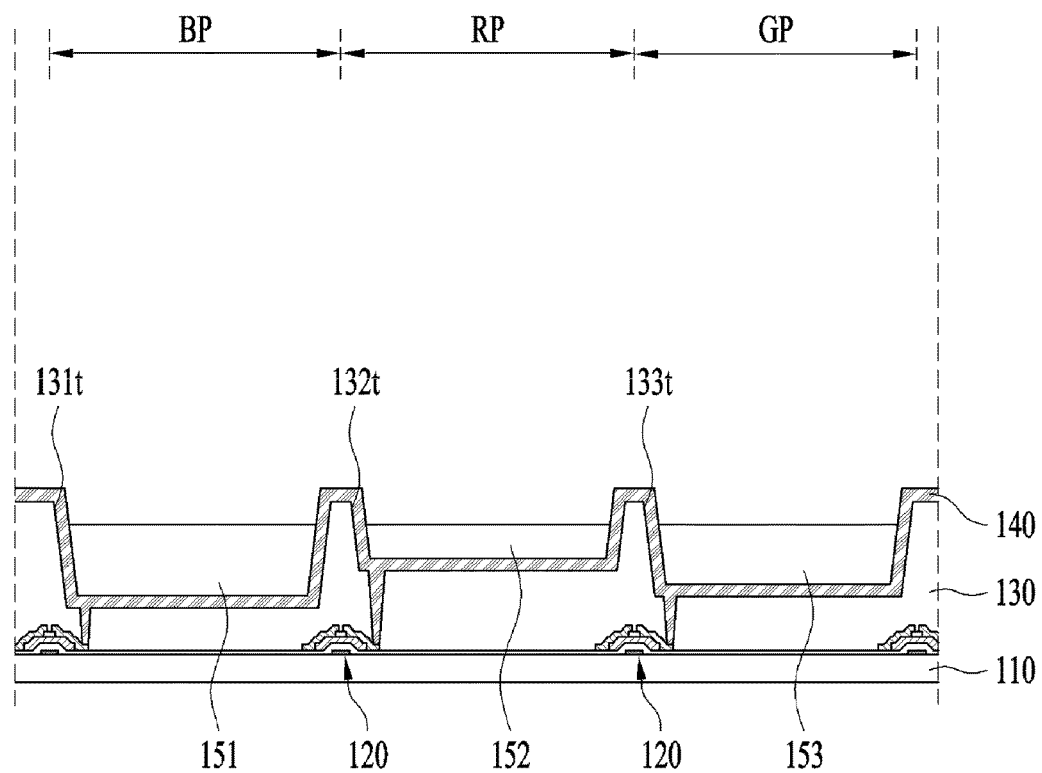

As shown in FIG. 3H, the method of forming the display device according to the embodiment of the present disclosure may include a step of forming resonant layers 151, 152 and 153 using the resonant material layer 150.

The step of forming the resonant layers 151, 152 and 153 may include a step of reducing a thickness of the resonant material layer 150 so that upper surfaces of the resonant layers 151, 152 and 153 are disposed at the inside of the corresponding trench 131t, 132t and 133t, respectively. The upper surfaces of the resonant layers 151, 152 and 153 may be disposed in the same plane. This reduction in thickness can be carried out by a blanket etch of the material 150, without the use of a mask for the etch. Since the layer 150 is uniformly deposited across the entire array and has a uniform height, a blanket etch can be used to reduce the depth of the material 150 to be fully within the trenches formed in the previous step and below the uppermost layer of layer 130. The etch can be a timed etch, which terminates after a certain time, or can be carried out using layer 140 as an etch stop indication layer. In this type of control for ending an etch, the etch continues until the layer 140 is exposed. Then, after the exposure of layer 140 by the etch, the etch continues for a short period of time in order to ensure that the layer 150 is reduced to a level below the top of layer 130. While a timed etch has advantages in some embodiments, the use of layer 140 as an etch stop indication layer provides the benefit that the exposure of layer 140 during the etching process provides a reliable method to ensure that the etch has been carried out sufficiently to remove all the material 150 that is above layer 140, and then the etch should be continued for an additional brief period of time after this. This ensures that the layer 150 will be etched away to a level below the uppermost portion of layer 130.

As shown in FIG. 3I, the method of forming the display device according to the embodiment of the present disclosure may include a step of forming the transparent electrode material layer 160 on the lower substrate 110 in which the resonant layers 151, 152 and 153 are formed.

The transparent electrode material layer 160 may be formed of a conductive material. The transparent electrode material layer 160 may be formed of a transparent material blanket deposited. For example, the transparent electrode material layer 160 may be formed of ITO or IZO. The transparent electrode layer 160 directly overlays, and is in electrical contact with, the exposed portions of layer 140. The etching of the prior step is carried out sufficient to ensure that electrical contact between the reflective electrode layer 140 and the transparent electrode layer 160 will occur when layer 160 is deposited. This permits the lower electrode 160 of the light emitting layer to be electrically connected to the drive transistors 120 via layer 140 using a blanket deposition process and later blanket etch process.

Figure 3J:
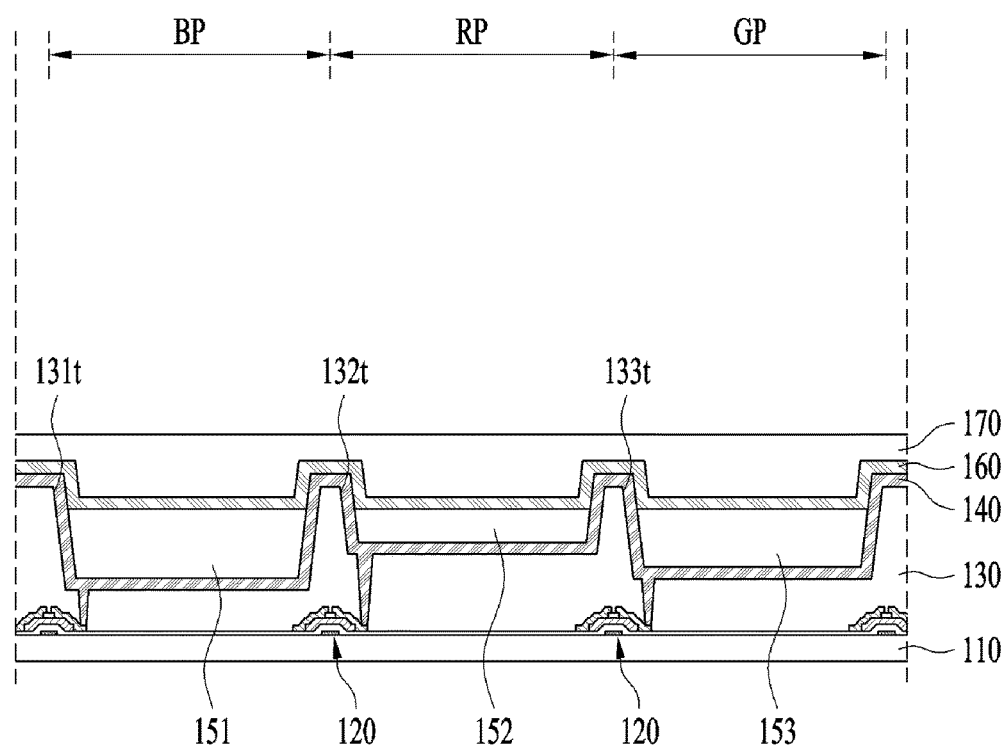

As shown in FIG. 3J, the method of forming the display device according to the embodiment of the present disclosure may include a step of forming mask material layer 170 on the transparent electrode material layer 160.

The mask material layer 170 may be formed of a material having an etch selectivity with the transparent electrode material layer 160 and the reflective electrode material layer 140. For example, the mask material layer 170 may be formed of a photo-resist material.

Figure 3K:
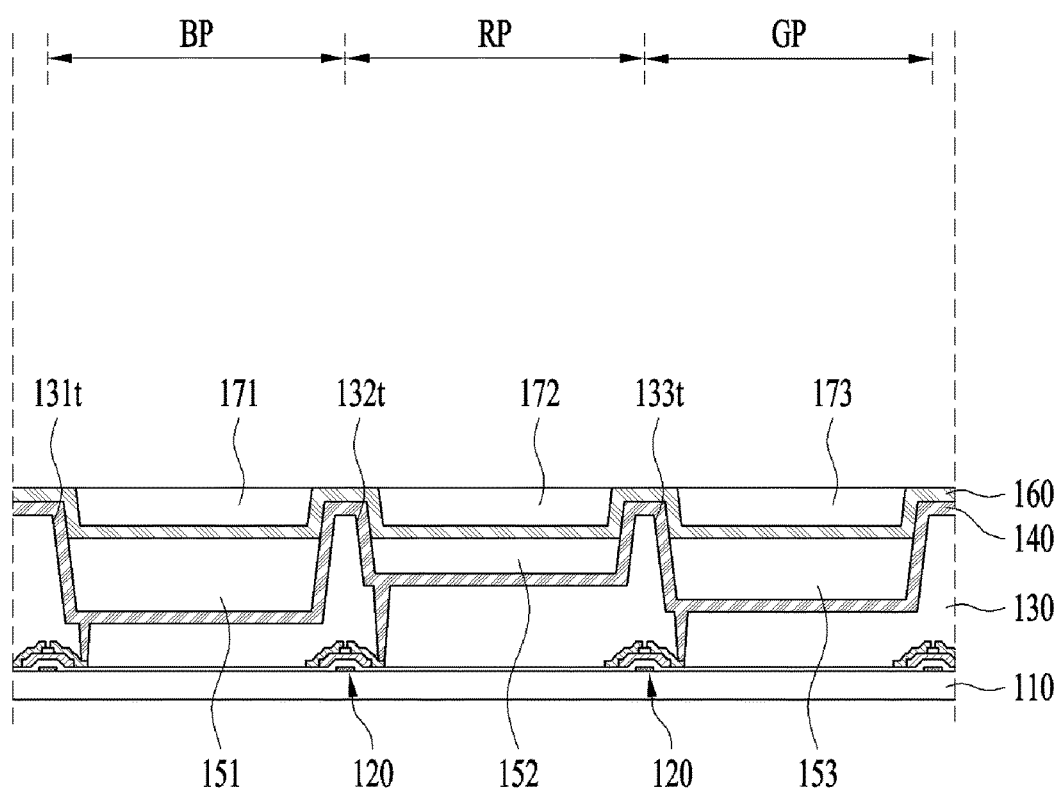

As shown in FIG. 3K, the method of forming the display device according to the embodiment of the present disclosure may include a step of forming mask patterns 171, 172 and 173 using the mask material layer 170.

The step of forming the mask patterns 171, 172 and 173 may include a step of reducing a thickness of the mask material layer 170 with a blanket etch so that an upper surface of the transparent electrode material layer 160 between trenches 131t, 132t and 133t is exposed. For example, the mask patterns 171, 172 and 173 may include a first mask pattern 171 overlapping with the first trench 131t, a second mask pattern 172 overlapping with the second trench 132t and a third mask pattern 173 overlapping with the third trench 133t. Because the layer 170 can be selectively etched with respect to the layer 160, the layer 170 can be blanket etched without use of a mask in place during the etching process. The etching continues until the layer 160 is exposed and, thus, layer 160 acts as an etch stop layer for this particular etch of layer 170. The upper surfaces of the mask patterns 171, 172 and 173 may be disposed in the same plane. This provides a self-aligned etch of material 160.

Figure 3L:
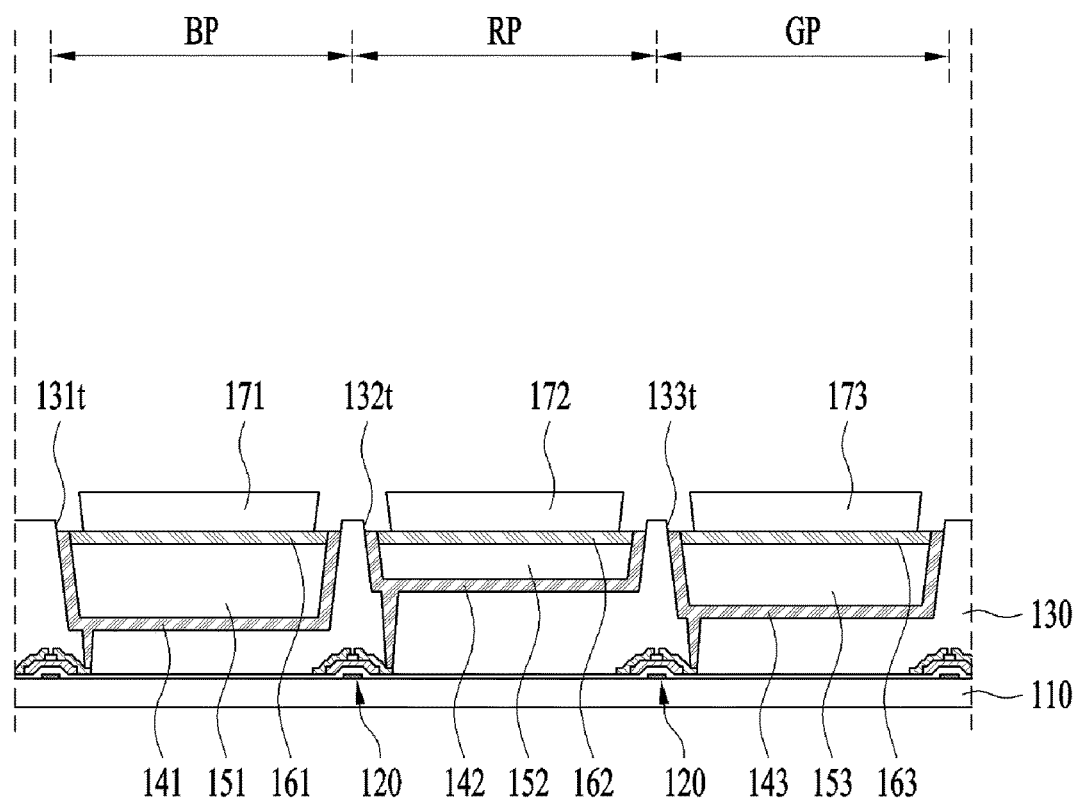

As shown in FIG. 3L, the method of forming the display device according to the embodiment of the present disclosure may include a step of forming reflective electrodes 141, 142 and 143 and transparent electrodes 161, 162 and 163 using the mask patterns 171, 172 and 173.

The step of forming the reflective electrodes 141, 142 and 143 and the transparent electrodes 161, 162 and 163 may include a step of dry etching the transparent electrode material layer 160 and the reflective electrode material layer 140 exposed by the mask patterns 171, 172 and 173 with a blanket etch.

The upper surfaces of the transparent electrodes 161, 162 and 163 may be lower than the upper surface of the interlayer insulating layer 130 between the trenches 131t, 132t and 133t. To this end, in the method of forming the display device according to the embodiment of the present disclosure, the step of forming the resonant layers 151, 152 and 153 may include a step of reducing the thickness of the resonant material layer 150 so that a distance between the upper surfaces of the resonant layers 151, 152 and 153 and the uppermost end of the interlayer insulating layer 130 may be larger than the thickness of the transparent electrode material layer 160.

Figure 3M:
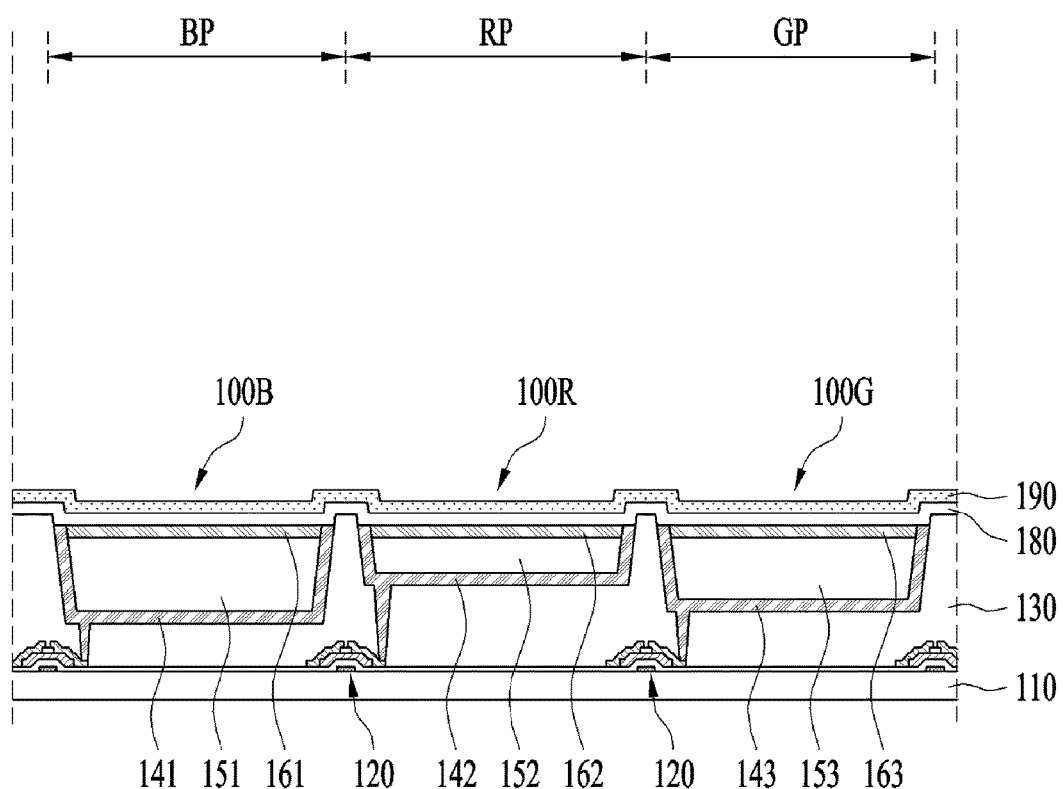

As shown in FIG. 3M, the method of forming the display device according to the embodiment of the present disclosure may include a step of forming light-emitting structures 100B, 100R and 100G having the reflective electrodes 141, 142 and 143, the resonant layers 151, 152 and 153, and the transparent electrodes 161, 162 and 163 on the pixel areas BP, RP and GP.

The step of forming the light-emitting structures 100B, 100R and 100P may include a step of removing the mask patterns 171, 172 and 173, with a blanket etch that is selective to remove the layer 170, but not layers 160 or 130. This is followed by a step of sequentially forming a light-emitting layer 180 and an upper electrode 190 on the lower substrate 110 in which the transparent electrodes 161, 162 and 163 are formed.

The etching of layer 160 in FIG. 3L is carried out using the insulating layer 130 as an etch stop layer. Namely, the etching of layer 160 is carried out as a selective etch to remove the material 160 as well as the material of layer 140 as a blanket etch which continues until layer 130 is exposed. After layer 130 is exposed, the etching continues for a brief period of time in order to assure full removal of all of layer 140 from the top of all portions of layer 130 so that there are no short circuit connections between adjacent pixels. The layer 130 provides an insulation layer between adjacent pixels to prevent the electrodes 141, 142, and 143 from being electrically connected to each other. Using layer 130 as an etch stop indication layer, with a continuation of the etch for a brief time after the exposure of layer 130, will always ensure that the lower electrode 160, as well as the electrical connection to it to the individual transistors via layer 140, is electrically isolated between the pixels without the need of an additional photolithographic step. In this particular etch, the layer 170 acts as a mask pattern with each of the sections 171, 172, and 173 acting as a mask to carry out the etch of the layer 160 and layer 140. However, this particular mask pattern was created without the use of a separate photolithographic step, and was self-aligned with each of the trenches. Thus, the present process provides the ability to make a mask material layer 170, but without the requirement that a separate photolithographic step be used to define the shape of that mask or its pattern. The mask material layer 170, in conjunction with layer 130, also controlled the depth of the resonant material inside the trench to ensure that the upper surface of the insulating layer is higher than the first electrode 161-160 of each respective pixel, and also higher than the resonant layer in the individual trenches.

Considering all the process steps from FIG. 3C to FIG. 3M, only a single photolithographic alignment mask was used for forming the light emission structure and various layers that it is made up of. Namely, the half-tone mask 400 was provided as a photolithographic mask in order to create the geometries and relative relationships between the sections 131, 132, and 133 to be etched. Subsequent to this half-tone mask 400, the structure for the organic light-emitting pixel was carried out without the need for additional photolithographic alignment steps or masking layers. While a mask was used to create the contact holes 131h-133h, this was to provide electrical contact, and did not define the shape, size, or dimensions of the pixel light-emitting area. In summary, layer 140 could be provided as a blanket deposition without a need for removal using a photolithographic step. Similarly, layers 150, 160, 170, 180, and 190 could all be deposited with blanket depositions, and etched with a blanket etch using the different materials as the etch stop layers without the need for additional photolithographic mask alignments. The process, which uses fewer photolithographic alignment masks provides an OLED array that is considerably lower cost to manufacture, while also being more reliable, because the structures are self-aligned.

As shown in FIG. 1, the method of forming the display device according to the embodiment of the present disclosure may include a step of locating an upper substrate 210 having color filters 221, 222 and 223 and a black matrix 230 on the upper electrode 190, and a step of attaching the upper substrate 210 to the lower substrate 110 in which the light-emitting structures 100B, 100R and 100G are formed using an adhesive layer 300.

Accordingly, the method of forming the display device according to the embodiment of the present disclosure may include a step of forming trenches 131t, 132t and 133t having different depths depending on the realized color of the pixel areas BP, RP and GP in the interlay insulating layer 130 covering the thin film transistors 120, and a step of forming a reflective electrode 141, 142 and 143, a resonant layer 151, 152 and 153, and a transparent electrode 161, 162 and 163 of the corresponding light-emitting structure 100B, 100R and 100G within each trench 131t, 132t and 133t. Thus, in the method of forming the display device according to the embodiment of the present disclosure, the process of forming the micro-cavity structure may be simplified, and the height difference of the light-emitting structures 100B, 100R and 100G may be reduced. Thereby, in the method of forming the display device according to the embodiment of the present disclosure, the luminous efficacy and the reliability may be improved without the decrease of the production efficacy.

In the result, the display device according to the embodiments of the present disclosure and the method of forming the same may include light-emitting structures having micro-cavity structure. The light-emitting structures may include transparent electrodes having the same thickness on the pixel areas which output different colors. Uppermost ends of the light-emitting structures may have substantially the same plane. Thus, in the display device according to the embodiments of the present disclosure and the method of forming the same, the process for forming the micro-cavity structure may be minimized, and the damage due to the micro-cavity structure may be prevented. Therefore, in the method of forming the display device according to the embodiment of the present disclosure, the luminous efficacy and the reliability may be improved without the decrease of the production efficacy.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   an interlayer insulating layer including a first trench and a second trench shallower than the first trench;
   a first light-emitting structure including a first reflective electrode, a first resonant layer and a first transparent electrode, which are sequentially stacked on a bottom surface of the first trench of the interlayer insulating layer; and
   a second light-emitting structure including a second reflective electrode, a second resonant layer and a second transparent electrode, which are sequentially stacked on a bottom surface of the second trench of the interlayer insulating layer,
   wherein an upper surface of the first transparent electrode and an upper surface of the second transparent electrode are lower than an upper surface of the interlayer insulating layer, the first reflective electrode extending along a sidewall of the first trench and being connected to the first transparent electrode, and the second reflective electrode extending along a sidewall of the second trench and being connected to the second transparent electrode.

2. The display device according to claim 1, wherein a thickness of the second resonant layer is smaller than a thickness of the first resonant layer.

3. The display device according to claim 1, wherein the transmissivity of the first resonant layer is higher than the transmissivity of the first transparent electrode, and
wherein the transmissivity of the second resonant layer is higher than the transmissivity of the second transparent electrode.

4. The display device according to claim 3, wherein the second resonant layer includes the same material as the first resonant layer.

5. The display device according to claim 1, wherein the upper surface of the second transparent electrode is coplanar with the upper surface of the first transparent electrode.

6. The display device according to claim 1, further comprising:
a first color filter on the first light-emitting structure; and
a second color filter on the second light-emitting structure,
wherein the light passing through the second color filter has a wavelength shorter than the light passing through the first color filter.

7. The display device according to claim 6, further comprising a black matrix between the first color filter and the second color filter,
wherein the black matrix overlaps with the upper surface of the interlayer insulating layer disposed between the first trench and the second trench.

8. A display device, comprising:
a lower substrate including a first pixel area and a second pixel area disposed close to the first pixel area, the second pixel area realizing a color different from the first pixel area;
a first light-emitting structure on the first pixel area of the lower substrate, the first light-emitting structure including a first resonant layer between a first reflective electrode and a first transparent electrode;
a second light-emitting structure on the second pixel area of the lower substrate, the second light-emitting structure including a second resonant layer between a second reflective electrode and a second transparent electrode; and
an interlayer insulating layer extending between the lower substrate and the first light-emitting structure, the interlayer insulating layer extending between the lower substrate and the second light-emitting structure,
wherein a portion of the interlayer insulating layer is disposed between the first transparent electrode of the first light-emitting structure and the second transparent electrode of the second light-emitting structure, the first reflective electrode extending along a first surface of the portion and being connected to the first transparent electrode, and the second reflective electrode extending along a second surface of the portion and being connected to the second transparent electrode.

9. The display device according to claim 8, wherein a distance between the lower substrate and the second transparent electrode is the same as a distance between the lower substrate and the first transparent electrode.

10. The display device according to claim 8, wherein the first resonant layer and the second resonant layer include an insulating material.

11. The display device according to claim 8, further comprising:
a first color filter on the first light-emitting structure; and
a second color filter on the second light-emitting structure,
wherein a lower surface of the first color filter and a lower surface of the second color filter are lower than the uppermost end of the interlayer insulating layer.

12. The display device according to claim 11, wherein the lower surface of the second color filter is coplanar with the lower surface of the first color filter.

13. A method for forming a display device, comprising:
forming an interlayer insulating layer on a lower substrate, the lower substrate including a first pixel area and a second pixel area disposed close to the first pixel area, the second pixel area realizing a color different from the first pixel area;
forming a first trench overlapping with the first pixel area of the lower substrate and a second trench overlapping with the second pixel area of the lower substrate in the interlayer insulating layer, the second trench having a depth different from the first trench;
forming a reflective electrode material layer on the interlayer insulating layer in which the first trench and the second trench are formed;
forming a resonant material layer filling the first trench and the second trench on the reflective electrode material layer;
forming a first resonant layer including an upper surface disposed at the inside of the first trench and a second resonant layer including an upper surface disposed at the inside of the second trench by reducing a thickness of the resonant material layer;
forming a transparent electrode material layer on the lower substrate in which the first resonant layer and the second resonant layer are formed;
forming a mask material layer on the transparent electrode material layer;
forming a first mask pattern overlapping with the first trench and a second mask pattern overlapping with the second trench by reducing a thickness of the mask material layer until an upper surface of the transparent electrode material layer between the first trench and the second trench is exposed;
forming a first reflective electrode and a first transparent electrode which are disposed in the first trench and a second reflective electrode and a second transparent electrode which are disposed in the second trench by etching the transparent electrode material layer and the reflective electrode material layer exposed by the first mask pattern and the second mask pattern; and
sequentially forming a light-emitting layer and an upper electrode on the first transparent electrode and the second transparent electrode after removing the first mask pattern and the second mask pattern.

14. The method according to claim 13, wherein the resonant material layer is formed of a material having a transmissivity higher than the transparent electrode material layer.

15. The method according to claim 13, wherein the reflective electrode material layer is formed to include an upper surface parallel with a surface of the lower substrate on a bottom surface of the first trench and a bottom surface of the second trench.

16. The method according to claim 13, wherein the first reflective electrode, the first transparent electrode, the second reflective electrode and the second transparent electrode are formed by dry etching process.

17. The method according to claim 13, wherein the step of forming the first resonant layer and the second resonant layer includes:
    reducing a thickness of the resonant material layer so that a vertical distance between upper surfaces of the first/second resonant layers and an upper surface of the interlayer insulating layer is larger than a thickness of the transparent electrode material layer.

\* \* \* \* \*